(12) United States Patent
Matsushita et al.

(10) Patent No.: US 6,426,235 B1
(45) Date of Patent: Jul. 30, 2002

(54) METHOD OF MANUFACTURING SEMICONDUCTOR DEVICE

(75) Inventors: Takeshi Matsushita; Shinichi Mizuno, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/689,191

(22) Filed: Oct. 12, 2000

(30) Foreign Application Priority Data

Oct. 14, 1999 (JP) .............................. 11-292885

(51) Int. Cl.[7] .............................................. H01L 21/00
(52) U.S. Cl. ......................................... 438/22; 438/960
(58) Field of Search .............................. 438/20, 21, 22, 438/48, 67, 455, 463, 497, 481, 479, 72, 459, 960

(56) References Cited

U.S. PATENT DOCUMENTS 4,816,420 A * 3/1989 Bozler et al. ................. 438/22
4,879,251 A   11/1989 Kruehler et al.
5,248,621 A * 9/1993 Sano ........................... 438/960
5,811,348 A * 9/1998 Matsushita et al. ......... 438/455
6,190,937 B1 * 2/2001 Nakagawa et al. ........... 438/67

FOREIGN PATENT DOCUMENTS

JP    9 135036    5/1997
JP   11 312815   11/1999

* cited by examiner

*Primary Examiner*—David Nelms
*Assistant Examiner*—David Nhu
(74) *Attorney, Agent, or Firm*—Sonnenschein, Nath & Rosenthal (57) ABSTRACT

The present invention provides a method of manufacturing a semiconductor device, particularly a solar cell, which is capable of forming a desired electrode pattern by a simple process at low cost. In the method, p-type semiconductor layers are formed on a silicon substrate, and a n-type semiconductor layer is formed on the p-type semiconductor layers, and partially removed in a predetermined pattern by laser abrasion to expose the p-type semiconductor layers, thereby forming an electrode pattern.

28 Claims, 11 Drawing Sheets

LIGHT INCIDENCE

METHOD OF MANUFACTURING SEMICONDUCTOR DEVICE

RELATED APPLICATION DATA

The present application claims priority to Japanese Application No. P11-292885 filed Oct. 14, 1999, which application is incorporated herein by reference to the extent permitted by law.

BACKGROUND OF THE INVENTION

1. Field of the Invention

The present invention relates to a method of manufacturing a semiconductor device, more specifically to a method of manufacturing a semiconductor device, which is capable of forming a desired electrode pattern by a simple process at low cost. Particularly, the present invention relates to a method of manufacturing a solar cell capable of decreasing the ineffective electrode area, which does not contribute to electric power generation, by a simple process at low cost, improving conversion efficiency.

2. Description of the Related Art

In a semiconductor device, generally, a first semiconductor layer is formed on the surface of a silicon substrate, a second semiconductor layer is formed on the first semiconductor layer, and then an electrode pattern is formed.

In this case, a photoresist mask or the like is conventionally used for forming the electrode pattern.

Although the electrode pattern can be formed in a desired pattern by this method, the use of the photoresist mask requires chemical treatments such as etching and mask removal, thereby causing the problem of complicating the process to increase the required time and cost.

Particularly, as disclosed in Japanese Unexamined Patent Publication No. 8-21345, for example, a thin film single crystal silicon solar cell is formed on a polycrystalline silicon layer formed on the surface of a single crystal silicon substrate, and the formed thin film single crystal silicon solar cell is separated from the single crystal silicon substrate, and transferred onto a plastic substrate to produce a thin film single crystal silicon solar cell. In the thus-produced thin film single crystal silicon solar cell, an electrode must be formed before the thin film single crystal silicon solar cell is separated from the single crystal substrate because of the low heat resistance of the plastic substrate. Therefore, anode and cathode must be inevitably formed on the surface of the solar cell on which light is incident, thereby causing the problem increasing the ineffective electrode area not contributing to power generation. In such a case, a photoresist mask is conventionally used to attempt to decrease the ineffective electrode area. However, the need for chemical treatments such as etching and mask removal complicates the process to increase the required time and cost.

SUMMARY OF THE INVENTION

Accordingly, the present invention provides a method of producing a semiconductor device which is capable of forming a desired electrode pattern by a simple process at low cost.

Another object of the present invention is to provide a method of manufacturing a solar cell, which is capable of decreasing the ineffective electrode area not contributing to power generation, by a simple process at low cost, thereby improving conversion efficiency.

The objects of the present invention can be achieved by a method of manufacturing an electronic device, comprising forming a first semiconductor layer on a substrate, forming a second semiconductor layer on the first semiconductor layer, and removing the second semiconductor layer in a predetermined pattern by using laser abrasion to expose the first semiconductor layer, to form an electrode pattern.

In the present invention, the semiconductor layer is removed in the predetermined pattern by laser abrasion, which permits fine patterning, to expose the first semiconductor layer, thereby permitting the manufacture of a semiconductor device having the desired electrode pattern by a simple process at low cost without using a photoresist mask or the like.

In a preferred embodiment of the present invention, the substrate is a silicon substrate.

In another preferred embodiment of the present invention, the silicon substrate is a single crystal silicon substrate.

In still another preferred embodiment of the present invention, the single crystal silicon substrate is a thin film single crystal silicon substrate.

In a further preferred embodiment of the present invention, the first semiconductor layer is formed on the substrate with a porous layer provided therebetween to produce a semiconductor device.

In a still further preferred embodiment of the present invention, the substrate is separated in the porous layer portion so that the first and second semiconductor layers are respectively supported by separate support substrates to enable reuse of the substrate.

In a further preferred embodiment of the present invention, the porous layer is a porous silicon layer.

In a further preferred embodiment of the present invention, the first semiconductor layer is a p-type semiconductor layer, and the second semiconductor layer is a n-type semiconductor layer.

In a further preferred embodiment of the present invention, the first semiconductor layer and the second semiconductor layer are formed by epitaxial growth to manufacture a semiconductor device.

In a further preferred embodiment of the present invention, the first semiconductor layer is partially removed according to the formed electrode pattern to form an electrode, manufacturing a semiconductor device.

In a further preferred embodiment of the present invention, after the electrode is formed, the substrate is bonded to a transparent substrate, and then separated in the porous layer portion, and a support substrate is bonded to the back of the first semiconductor layer to manufacture a semiconductor device.

In a further preferred embodiment of the present invention, the transparent substrate comprises a plastic film.

In a further preferred embodiment of the present invention, a semiconductor device can be made lightweight and flexible, and can be manufactured at low cost.

In a further preferred embodiment of the present invention, the support substrate comprises a plastic film.

In a further preferred embodiment of the present invention, the strength of the porous layer is decreased by using ultrasonic energy so that the substrate is separated in the porous layer portion to manufacture a semiconductor device.

In a further preferred embodiment of the present invention, before the support substrate is bonded to the back of the first semiconductor layer, the porous layer remaining on the surface of the first semiconductor layer is removed to manufacture of a semiconductor device.

In a further preferred embodiment of the present invention, after the electrode is formed, the substrate is bonded to a support substrate, and then separated in the porous layer portion, and a transparent substrate is bonded to the back of the first semiconductor layer after a protecting layer of silicon oxide is formed at low temperature on the back of the first semiconductor layer, In a further preferred embodiment of the present invention, at least one porous film is formed to pass through the first and second semiconductor layers between the formation of the first semiconductor layer and the second semiconductor layer and the formation of the electrode pattern, and the at least one porous layer is thermally oxidized to form at least one insulating separation film so that adjacent devices comprising the adjacent first and second semiconductor layer are insulated and separated from each other to manufacture a semiconductor device.

In a further preferred embodiment of the present invention, not less than two porous films are formed.

In a further preferred embodiment of the present invention, the porous films comprise porous silicon.

In a further preferred embodiment of the present invention, the first and second semiconductor layers constitute a light generating device.

In a further preferred embodiment of the present invention, a solar cell can be manufactured at low cost by a simple process, in which the ineffective electrode area, which does not contribute to power generation, is decreased to improve conversion efficiency. Namely, the solar cell is produced by forming an electrode on a substrate, bonding the substrate to a transparent substrate, separating the substrate in the porous layer portion, and bonding a support substrate to the back of the first semiconductor layer. In this case, the first semiconductor layer is removed in the predetermined pattern by laser abrasion, which permits fine patterning, to expose the second semiconductor layer, thereby decreasing the ineffective electrode area, and manufacturing a single cell-type solar cell having the desired electrode pattern. A solar cell can also be manufactured by forming an electrode on a substrate, bonding the substrate to a support substrate, separating the substrate in the porous layer portion, forming a protecting layer of silicon oxide on the back of the first semiconductor layer at low temperature, and bonding a transparent substrate to the back of the first semiconductor layer. In this case, a back contact-type solar cell can be manufactured, in which light is incident on the back, and the ineffective electrode area can be significantly decreased to improve conversion efficiency. A solar cell may be manufactured by forming first and second semiconductor layers, forming at least one porous film to pass through the first and second semiconductor layers, and thermally oxidizing the at least one porous film to form at least one insulating separation film so that adjacent devices comprising the adjacent first and second semiconductor layers are insulated and separated from each other before an electrode pattern is formed. In this case, the at least one porous film formed to pass through the first and second semiconductor layers is thermally oxidized to form the insulating separation film, thereby insulating and separating the adjacent devices. Therefore, a back contact-type integrated solar cell can be manufactured with a high working efficiency without separation of the first and second semiconductor layers from the substrate in manufacturing.

DESCRIPTION OF THE PREFERRED EMBODIMENTS

Preferred embodiments of the present invention are described in detail below with reference to the attached drawings.

FIGS. 1 to 7 are drawings respectively showing the steps of the process for manufacturing a single cell-type thin film single crystal silicon solar cell.

Figure 1:
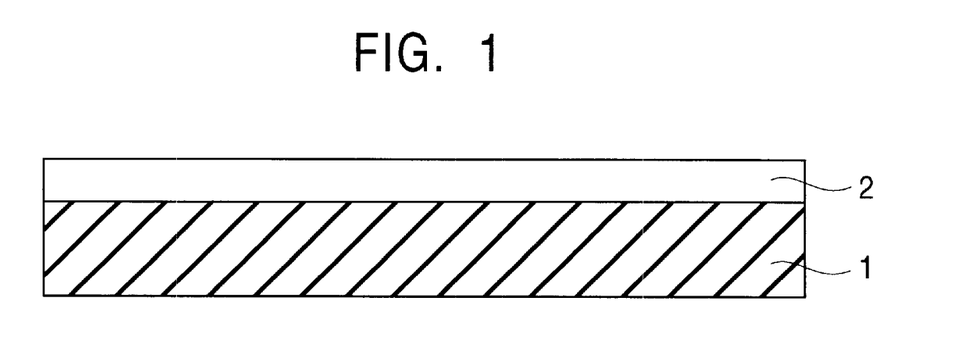
FIG. 1 is a drawing showing a step of a process for manufacturing a single cell-type thin film single crystal silicon solar cell in accordance with a preferred embodiment of the present invention.

In manufacturing the single cell-type thin film single crystal silicon solar cell, as shown in FIG. 1, a porous silicon layer 2 is first formed on a surface of a p-type single crystal silicon substrate 1 containing p-type impurities of boron or the like, and having a resistivity of 0.01 to 0.02 Ω·cm, for example, by an anodization method. Namely, to form an epitaxial layer having excellent crystallinity, first anodization treatment is performed for 2 to 10 minutes, for example, 8 minutes, at a current density of, for example, 0.5 to 3 mA/cm$^2$ to form a first porous silicon layer (not shown) having a low porosity on the porous silicon layer 2. Then, second anodization treatment is performed for 2 to 10 minutes, for example, 8 minutes, at a current density of, for example, 3 to 20 mA/cm$^2$, to form a second porous silicon layer (not shown) having a medium porosity, and then third anodization treatment is performed for several seconds at a current density of, for example, 40 to 300 mA/cm$^2$, to form a third porous silicon layer (not shown) having a high porosity. The thickness of the porous silicon layer 2 is 2 to 10 μm, preferably about 8 μm. The anodization method comprises passing a current in a hydrofluoric acid solution using the silicon substrate 1 as an anode. An example of known anodization methods is the double cell method disclosed in "Surface Technology Vol. 46, No. 5, p8–13, 1995, "Anodization of Porous Silicon" by Itoh et al."

In this method, the silicon substrate 1 on which the porous silicon layer 2 is to be formed is placed between two electrolytic tanks, platinum electrodes connected to a DC power source are provided in the two electrolytic tanks containing an electrolyte so that a DC voltage is applied by using the silicon substrate 1 as an anode, and the platinum electrodes as cathodes to make porous one surface of the silicon substrate 1 by corrosion. As the electrolyte, for example, an electrolyte containing hydrofluoric acid and ethyl alcohol at a volume ratio of 3:1 to 1:1 is preferably used.

Figure 2:
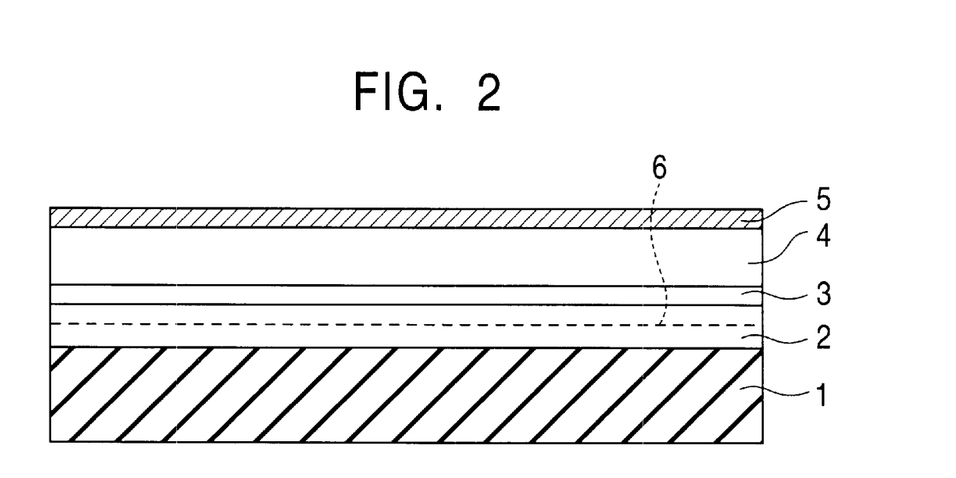
FIG. 2 is a drawing showing a step of the process for manufacturing the single cell-type thin film single crystal silicon solar cell in accordance with the preferred embodiment of the present invention.

Next, as shown in FIG. 2, the surface of the porous silicon layer 2 is annealed with hydrogen at 1050 to 1200° C., for example, 1100° C., for 5 to 30 minutes to close the many pores formed in the surface of the porous silicon layer 2. Then, a p$^+$-type layer 3 is epitaxially grown to a thickness of 0.1 to 1 μm on the surface of the porous silicon layer 2 by using gas such as SiH$_4$, SiCl$_4$, SiCl$_3$, SiHCl$_3$, SiH$_2$Cl$_2$, or the like at 1000 to 1150° C., for example, 1070° C., and a p-type layer 4 is continuously epitaxially grown to a thickness of 1 to 50 μm so that the impurity concentration is 10$^{14}$ to 10$^{18}$/cm$^2$. Then, a n$^+$-type layer 5 used as a cathode is formed to a thickness of 0.1 to 1 μm by diffusion or epitaxial growth.

In the process of hydrogen annealing, epitaxial growth and diffusion process, silicon atoms in the porous silicon layer 2 move to be rearranged, and thus the third porous silicon layer is significantly decreased in tensile strength and converted to a separation layer 6. The separation layer 6 has tensile strength which does not cause partial or complete separation of the p$^+$-type layer 3 and the p-type layer 4 from the silicon substrate 1.

Figure 3:
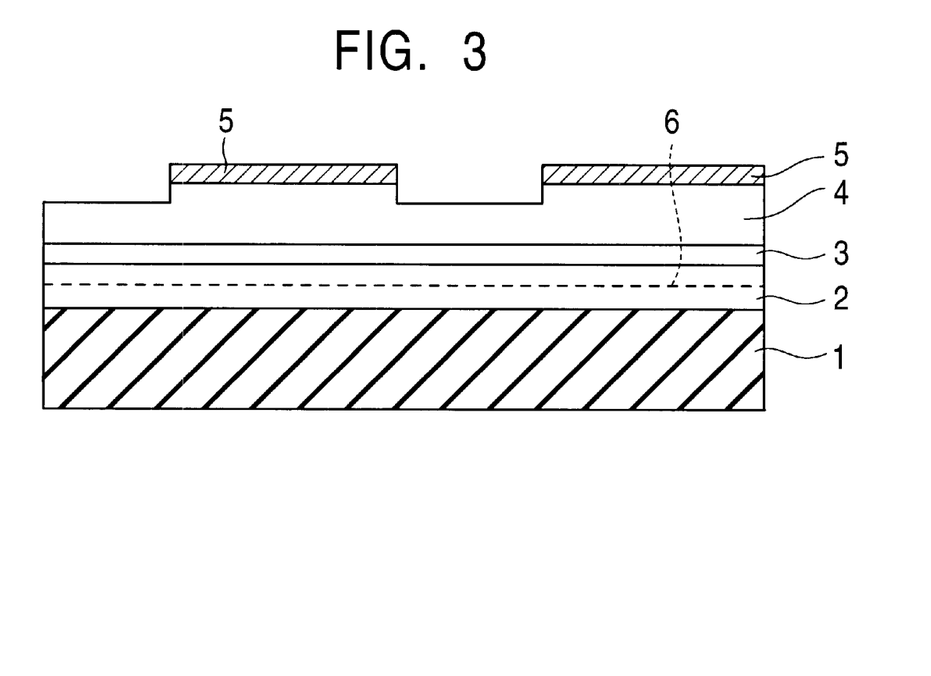
FIG. 3 is a drawing showing a step of the process for manufacturing the single cell-type thin film single crystal silicon solar cell in accordance with the preferred embodiment of the present invention.

Furthermore, as shown in FIG. 3, the n$^+$-type layer 5 is partially removed in a predetermined pattern by laser abrasion using an excimer layer to expose the p-type layer 4 serving as the anode. In this embodiment, the n$^+$-type layer 5 serving as the cathode is partially removed by laser abrasion, which permits fine patterning, to expose the p-type layer 4 serving as the anode, and thus the desired electrode pattern can be formed with the decreased ineffective electrode area at low cost without using a photoresist mask or the like.

Figure 4:
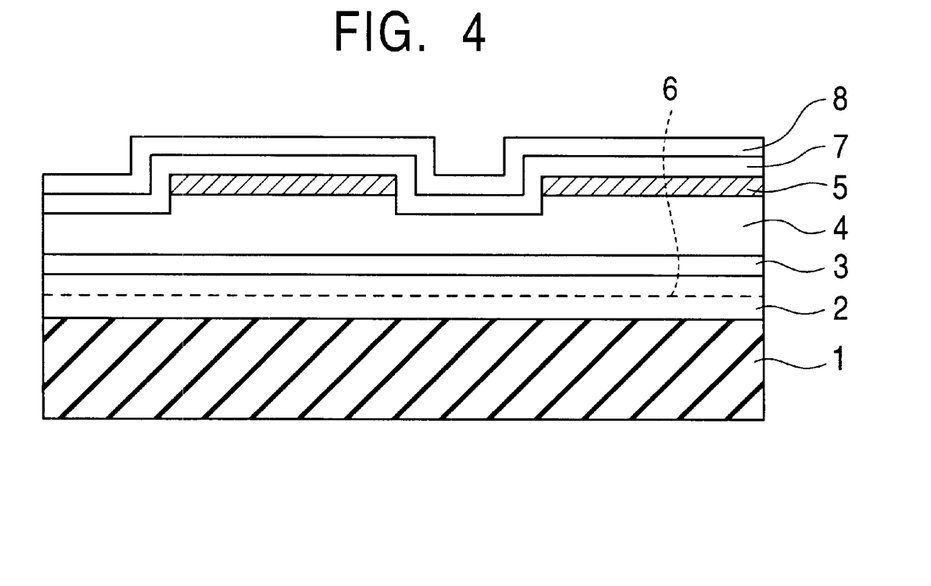
FIG. 4 is a drawing showing a step of the process for manufacturing the single cell-type thin film single crystal silicon solar cell in accordance with the preferred embodiment of the present invention.

Next, as shown in FIG. 4, in order to protect the exposed p-n+ junctions, a silicon oxide film 7 is formed by thermal oxidation at 800 to 1000° C., and a titanium oxide anti-reflection film 8 is further formed.

Figure 5:
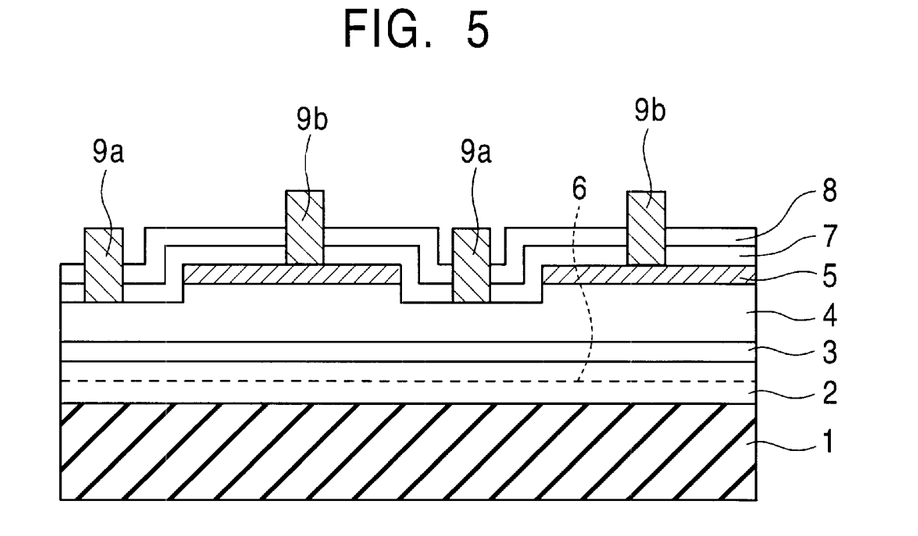
FIG. 5 is a drawing showing a step of the process for manufacturing the single cell-type thin film single crystal silicon solar cell in accordance with the preferred embodiment of the present invention.

Then, as shown in FIG. 5, electrode windows are formed by laser abrasion using an excimer laser or the like, and anodes 9a and cathodes 9b are formed in the apertures formed in the titanium oxide anti-reflection film 8, for example, by screen-printing metal paste.

Figure 6:
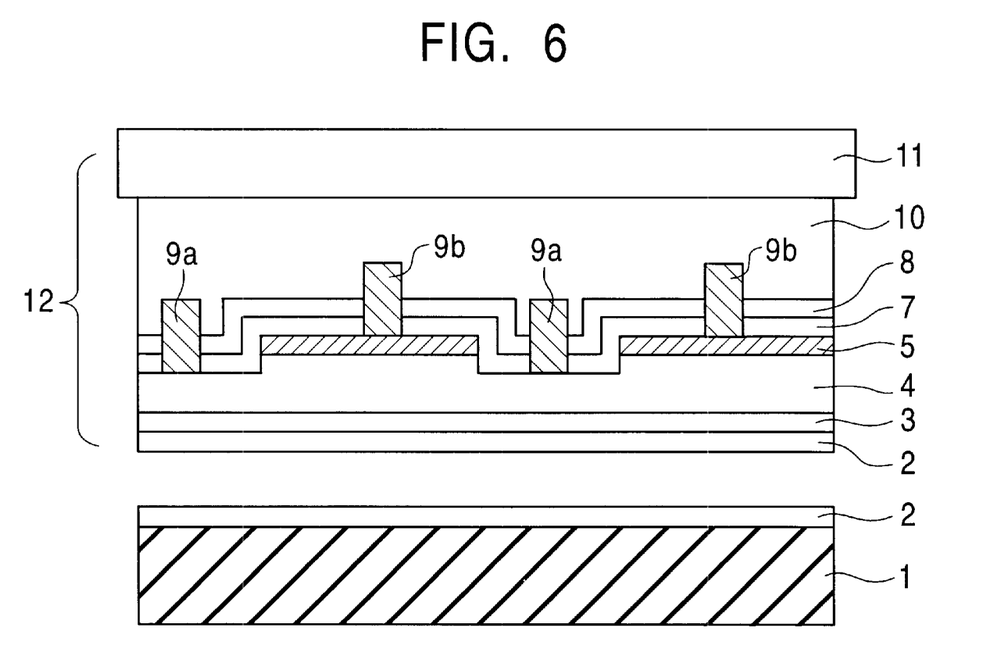
FIG. 6 is a drawing showing a step of the process for manufacturing the single cell-type thin film single crystal silicon solar cell in accordance with the preferred embodiment of the present invention.

Then, a transparent plastic film 11 is bonded by using an adhesive 10, and the silicon substrate 1 is then immersed in water or an ethyl alcohol solution, followed by irradiation of the silicon substrate 1 with, for example, ultrasonic waves of 25 kHz and 600 W. As a result, the peeling strength of the separation layer 6 is weakened by ultrasonic energy to break the separation layer 6 so that the silicon substrate 1 is separated from a solar cell device 12, as shown in FIG. 6.

Figure 7:
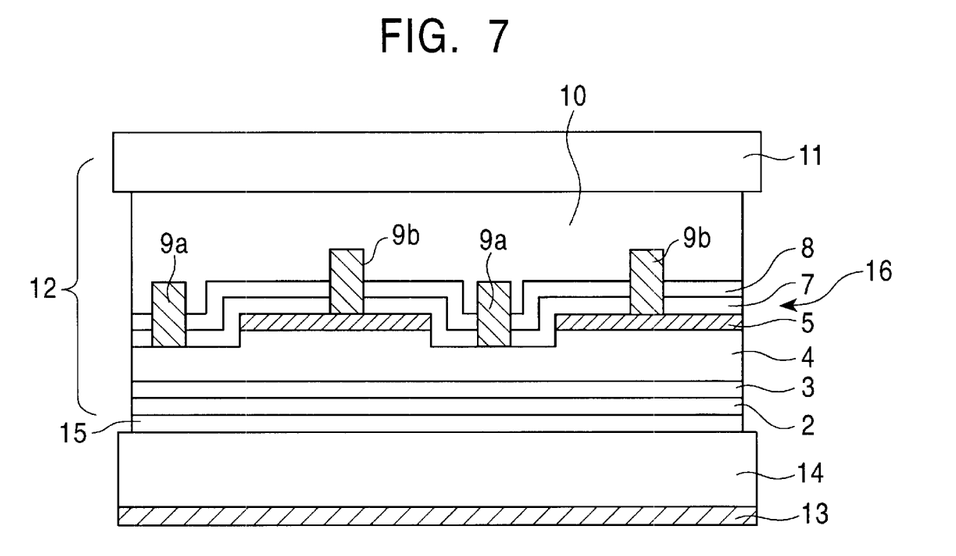
FIG. 7 is a drawing showing a step of the process for manufacturing the single cell-type thin film single crystal silicon solar cell in accordance with the preferred embodiment of the present invention.

Since the porous silicon layer 2 remains on the back of the solar cell device 12 from which the silicon substrate 1 is separated, the porous silicon layer 2 on the back of the solar cell device 12 is removed by rotation silicon etching using a mixed solution of hydrofluoric acid and nitric acid. Then, a plastic film 14 comprising a reflecting film 13 formed on the back thereof is bonded with an adhesive 15 to produce a single cell-type thin film single crystal silicon solar cell 16, as shown in FIG. 7.

The porous silicon layer 2 remaining on the surface of the silicon substrate 1 separated from the single cell-type thin film single crystal silicon solar cell 12 is removed by electrolytic polishing, rotation silicon etching, or the like so that the silicon substrate 1 is reused.

In this embodiment, since the n$^+$-type layer 5 serving as the cathode is removed in the predetermined pattern by laser abrasion, which permits fine patterning, to expose the p-type layer 4 serving as the anode, a single cell-type thin film single crystal silicon solar cell can be manufactured at low coast without using a photoresist mask or the like, in which the ineffective electrode can be decreased to significantly improve the conversion efficiency.

In this embodiment, since the n$^+$-type layer 5 serving as the cathode is removed in the predetermined pattern by laser abrasion, which permits fine pattering, to expose the p-type layer 4 serving as the anode, the single cell-type thin film single crystal silicon solar cell having the desired electrode pattern can be manufactured.

FIGS. 8 to 11 are drawings respectively showing steps of the process for manufacturing a back contact-type thin film single crystal silicon solar cell in accordance with another preferred embodiment of the present invention.

In the single cell-type thin film single crystal silicon solar cell 12 produced by the process shown in FIGS. 1 to 7, the anodes 9a and the cathodes 9b are formed on the surface, and thus sufficient improvement in the conversion efficiency is limited because of the large ineffective electrode area. Therefore, in this embodiment, the anodes 9a and the cathodes 9b are formed on the back of the solar cell device 12 to manufacture a so-called back contact-type thin film single crystal silicon solar cell.

Like in the embodiment shown in FIGS. 1 to 3, a porous silicon layer 2 is formed on a p-type single crystal silicon substrate 1, and a $p^+$-type layer 3, a p-type layer 4 and a $n^+$-type layer 5 are formed on the porous silicon layer 2. After a separation layer 6 is formed, the $n^+$-type layer 5 serving as a cathode is partially removed in a desired pattern by laser abrasion using an excimer laser to expose the p-type layer 4 serving as an anode, thereby forming an electrode pattern. In this embodiment, the $n^+$-type layer 5 serving as the cathode is partially removed in the desired pattern by laser abrasion, which enables fine patterning, to expose the p-type layer serving as the anode, thereby permitting formation of the desired fine electrode pattern at low cost without using a photoresist mask or the like.

Figure 8:
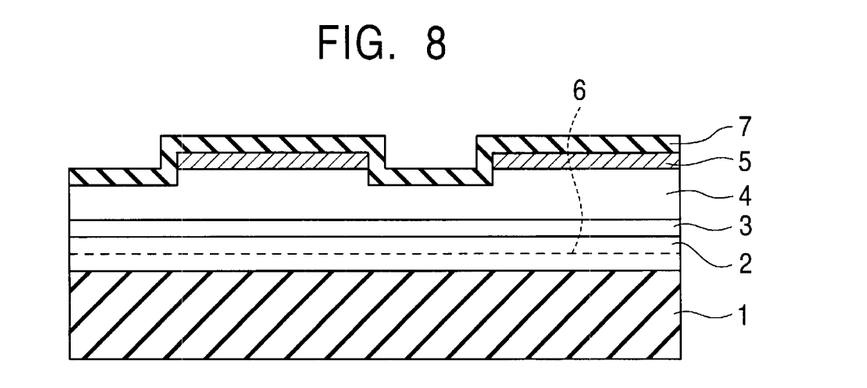
FIG. 8 is a drawing showing a step of a process for manufacturing a back contact-type thin film single crystal silicon solar cell in accordance with another preferred embodiment of the present invention.

Next, in order to protect the exposed p-n+ junctions, a silicon oxide film 7 is formed by thermal oxidation at 800 to 1000° C., as shown in FIG. 8.

Figure 9:
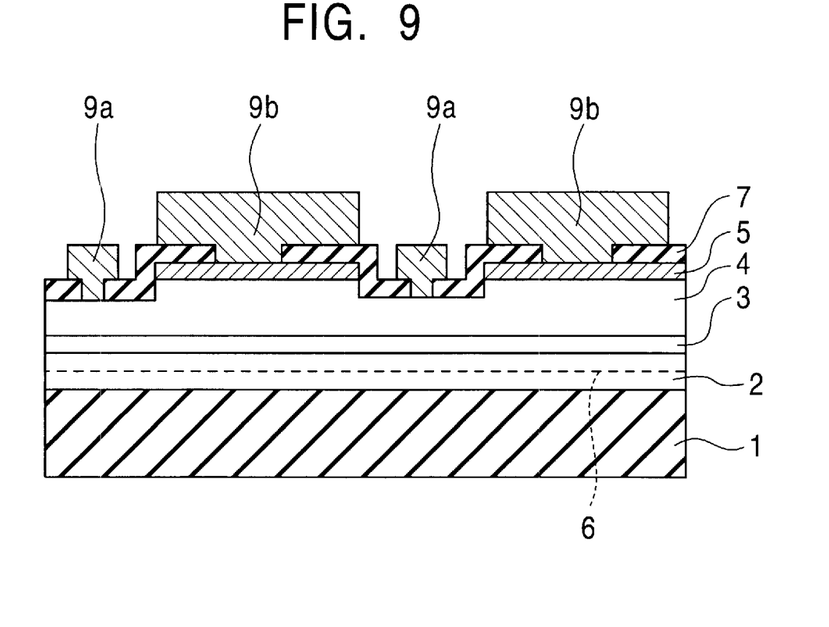
FIG. 9 is a drawing showing a step of the process for manufacturing the back contact-type thin film single crystal silicon solar cell in accordance with the other preferred embodiment of the present invention.

Then, as shown in FIG. 9, electrode windows are formed by laser abrasion using an excimer laser, and metal paste is screen-printed in the apertures formed in the silicon oxide film 7 to form anodes 9a and cathodes 9b. The anodes 9a and the cathodes 9b preferably have a large area in order to reflect light as much as possible, which is incident on the back of the solar cell and transmitted therethrough.

Figure 10:
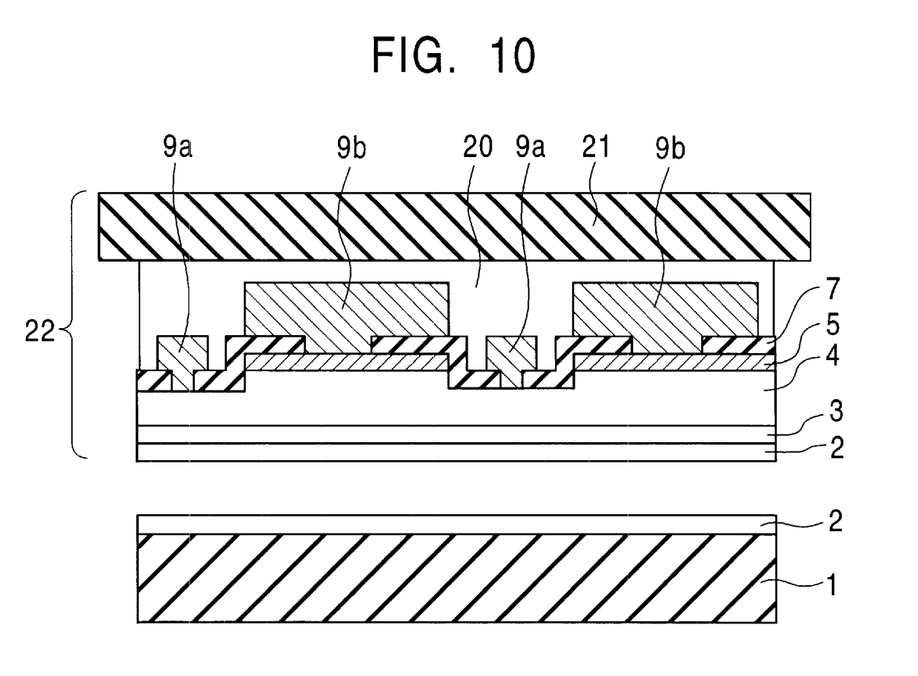
FIG. 10 is a drawing showing a step of the process for manufacturing the back contact-type thin film single crystal silicon solar cell in accordance with the other preferred embodiment of the present invention.

Then, an opaque plastic film 21 is bonded to the silicon substrate 1 with an adhesive 20, and the silicon substrate 1 is immersed in water or an ethyl alcohol solution, followed by irradiation of the silicon substrate 1 with, for example, ultrasonic waves of 25 kHz and 600 W. As a result, the peeling strength of the separation layer 6 is weakened by ultrasonic energy to break the separation layer 6, thereby separating the silicon substrate 1 from the solar cell 22, as shown in FIG. 10.

Since the porous silicon layer 2 remains on the back of the solar cell 22 from which the silicon substrate 1 is separated, the porous silicon layer 2 remaining on the back of the solar cell 22 is removed by the rotating silicon etching process using a mixed solution of hydrofluoric acid and nitric acid to expose the p+-type layer 3. Furthermore, in order to decrease the recombination rate of the exposed surface of the $p^+$-type layer 3, a solution obtained by dissolving silica in an organic solvent is coated on the surface of the $p^+$-type layer 3 to form a silica-containing layer (not shown). The silica-containing layer is oxidized with ozone produced by UV irradiation to form a protecting film 23 having a thickness of 10 nm or less on the surface of the $p^+$-type layer 3.

Namely, the silica solution obtained by dissolving silica in the organic solvent containing alcohol as a main component, and ester and ketone is coated on the surface of the p+-type layer 3 to form the silica-containing layer, followed by irradiation with ultraviolet rays. As a result, ozone is produced to evaporate the organic solvent in the silica-containing layer, and further oxidize silica in the silica-containing layer by the produced ozone, forming the protecting film 23 of silicon oxide. For example, ozone can be produced by irradiation with ultraviolet rays at a wavelength of 172 nm by using an excimer ultraviolet lamp at 1 to 100 mW/cm$^2$ for 1 second to 30 minutes, preferably at 5 to 100 mW/cm$^2$ for 1 second to 2 minutes, to form the protecting film 23 of silicon oxide.

In this embodiment, ozone is produced by ultraviolet irradiation of the surface of the $p^+$-type layer 3 on which the silica-containing layer is formed by coating the silica solution, to evaporate the organic solvent in the silica-containing layer and oxidize silica by the produced ozone, forming the protecting film 23 of silicon oxide at low temperature. Therefore, the opaque plastic film 21 having low heat resistance is not damaged, and the adhesive 21 used for bonding the opaque plastic film 21 is not damaged. In addition, no vacuum equipment is required, and the cost of the apparatus used is low, thereby permitting formation of the protecting film 23 at low cost as compared with formation of the protecting film 23 by sputtering or low-temperature CVD.

Therefore, electron diffusion from the inside of the solar cell 22 to the surface of the $p^+$-type layer 3 is prevented by the high-concentration $p^+$-type layer 3, and thus the rate of surface recombination of the $p^+$-type layer 3 and the protecting film 23 can be decreased.

Then, a solution containing titanium oxide ($TiO_x$) is coated on the surface of the protecting film 23, and irradiated with ultraviolet rays to dry the coated film and oxidize or reduce titanium oxide, to form a titanium oxide anti-reflection film 24 mainly composed of titanium dioxide and having a thickness of 10 to 100 nm on the surface of the protecting film 23. Furthermore, a plastic film 26 is bonded to the surface of the titanium oxide anti-reflection film 24 with an adhesive 25 to produce a back contact-type thin film single crystal silicon solar cell 27, as shown inn FIG. 11.

In accordance with this embodiment, the $n^+$-type layer 5 serving as the cathode is partially removed in the desired pattern by laser abrasion, which enables fine patterning, to expose the p-type layer 4 serving as the anode, thereby permitting formation of the desired fine electrode pattern at low cost without using a photoresist mask.

Figure 11:
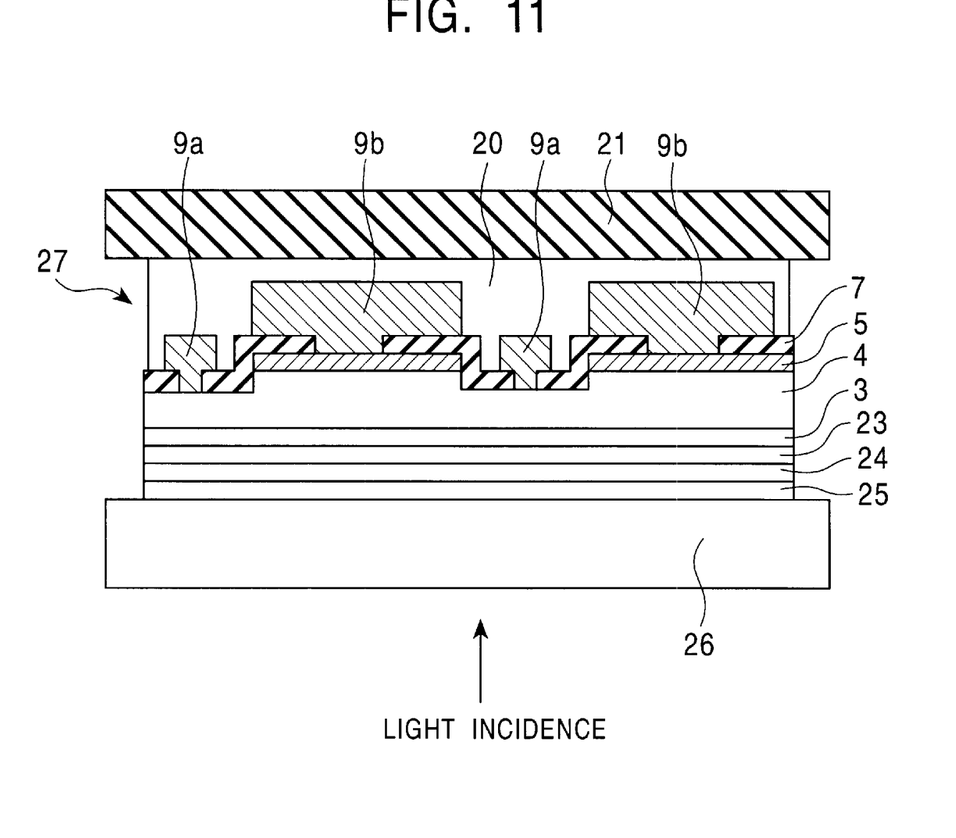
FIG. 11 is a drawing showing a step of the process for manufacturing the back contact-type thin film single crystal silicon solar cell in accordance with the other preferred embodiment of the present invention.

In the back contact-type thin film single crystal silicon solar cell 27 produced in this embodiment, light is incident on the plastic film 26, and thus the ineffective electrode area can be decreased due to the absence of electrodes on the incidence plane, thereby significantly improving the conversion efficiency.

Furthermore, in this embodiment, ozone is produced by ultraviolet irradiation of the surface of the $p^+$-type layer 3 on which the silica solution is coated, to evaporate the organic solvent in the silica-containing layer and oxidize silica in the silica-containing layer by the produced ozone, thereby forming the protecting film 23 of silicon oxide at low temperature. Therefore, damage to the opaque plastic film 21 having low heat resistance and damage to the adhesive 20 used for bonding the opaque plastic film 21 can be effectively prevented. In addition, no vacuum equipment is required, and the cost of the apparatus used is low, thereby permitting formation of the protecting film 23 at low cost and decreasing surface recombination, as compared with formation of the protecting film 23 by sputtering or low-temperature CVD.

FIGS. 12 to 17 are drawings showing steps of the process for manufacturing an integrated thin film single crystal silicon solar cell in accordance with still another preferred embodiment of the present invention.

Like in the embodiment shown in FIGS. 1 to 3, a porous silicon layer 2 is formed on a p-type single crystal silicon substrate 1, and a $p^+$-type layer 3, a p-type layer 4 and a $n^+$-type layer 5 are formed on the porous silicon layer 2. Furthermore, a separation layer 6 is formed.

Figure 12:
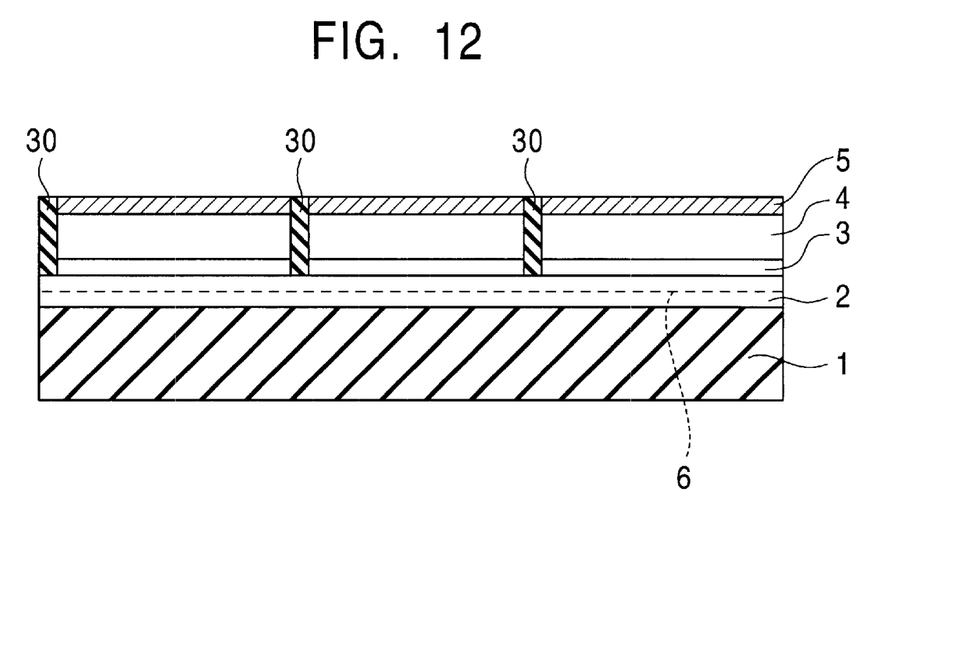
FIG. 12 is a drawing showing a step of a process for manufacturing an integrated thin film single crystal silicon solar cell in accordance with a further preferred embodiment of the present invention.

Next, as shown in FIG. 12, porous silicon layers 30 having high porosity are formed by anodization to pass through the n⁺-type layer 5, the p-type layer 4, and the p⁺-type layer 3, and reach the porous silicon layer 2. As the porosity of the porous silicon layers 30, for example, a porosity of 40 to 80 volume % is selected.

Figure 18:
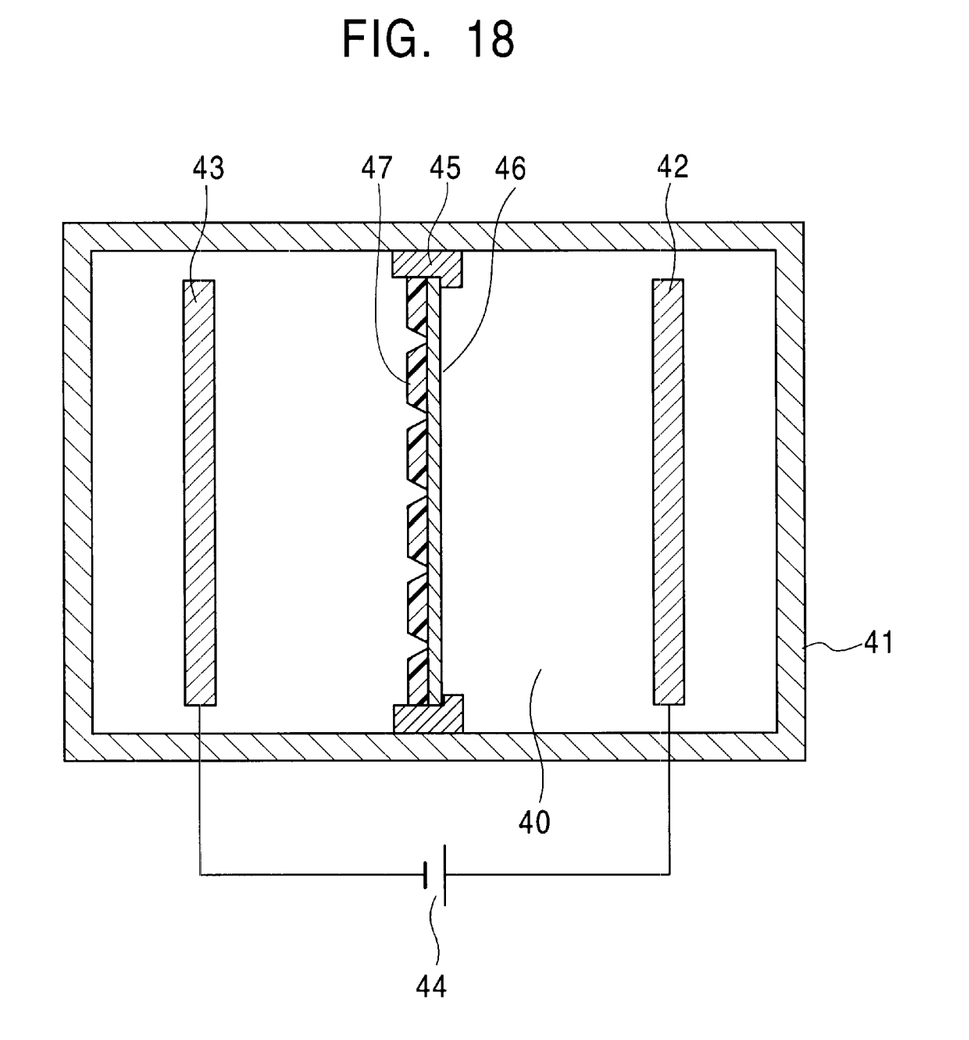
FIG. 18 is a schematic sectional view of an anodization apparatus.

FIG. 18 is a schematic sectional view of an anodization apparatus for forming the porous silicon layers 30.

As shown in FIG. 18, for example, a pair of platinum electrodes 42 and 43 are provided in an electrolytic tank 41 containing an electrolytic solution 40 containing hydrofluoric acid and ethyl alcohol at a volume ratio of 3:1 to 1:1, the pair of platinum electrodes 42 and 43 being connected to a DC power source 44. A layered product 46 comprising the silicon substrate 1, the porous silicon layer 2, the p⁺-type layer 3, the p-type layer 4 and the n⁺-type layer 5 shown in FIG. 2 is supported by a support member 45 made of an insulating material, and a mask 47 made of a vinyl chloride resin is also supported by the support member 45 on the negative platinum electrode 43 side of the layered product 46. As a result, the electrolytic tank 41 is divided into two parts by the support member 45, the layered product 46 and the mask 47.

Figure 19:
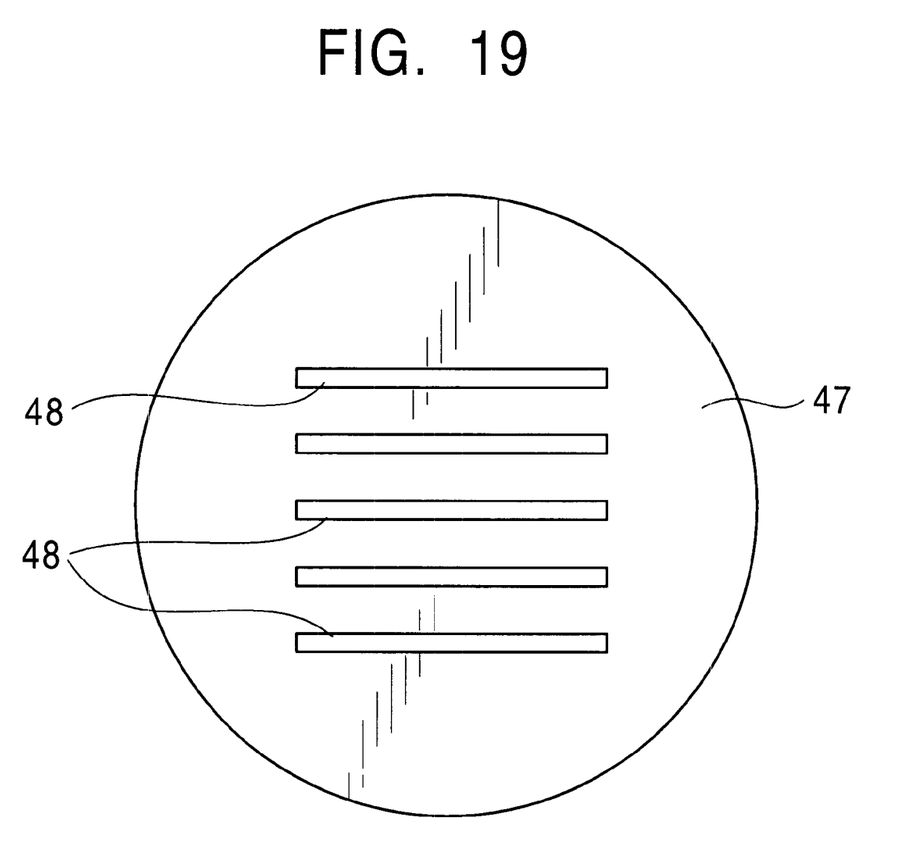
FIG. 19 is a schematic plan view of a mask.

FIG. 19 is a schematic plan view of the mask 47.

As shown in FIG. 19, the mask 47 has a plurality of rectangular apertures 48 formed by, for example, laser processing. Each of the rectangular apertures 48 has a width of 20 μm, for example.

As shown in FIG. 18, each of the rectangular apertures 48 is formed to communicate with the portion of the mask 47, which is formed by laser processing to have a substantially wedge cross-sectional shape.

The porous silicon layers 30 are formed by the anodization apparatus having the above-described construction as follows.

First, the layered product 46 comprising the silicon substrate 1, the porous silicon layer 2, the p⁺-type layer 3, the p-type layer 4 and the n⁺-type layer 5, and the mask 47 are positioned in the electrolytic solution 40 so that the plurality of rectangular apertures 48 of the mask 47 are located at positions corresponding to the positions where the porous silicon layers 30 are formed in the n⁺-type layer 5, the p-type layer 4 and the p⁺-type layer 3.

Next, a current is passed between the positive platinum electrode 42 and the negative platinum electrode 43 by using the DC power source 44. In this case, the support member 45 is made of an insulating material, and thus the current flows only in the electrolytic solution 40.

The mask 47 made of a vinyl chloride resin and the plurality of rectangular apertures 48 is disposed on the negative platinum electrode 43 side of the layered product 46 in the electrolytic solution 40, and thus the current flows through the portions of the layered product 46, which correspond to the plurality of rectangular apertures 48 formed in the mask 47.

As a result, the porous silicon layers 30 are formed in the portions of the layered product 46, which correspond to the plurality of rectangular apertures 48 formed in the mask 47.

The current value and the anodization time are selected so that the porous silicon layers 30 are formed to pass through the n⁺-type layer 5, the p-type layer 4 and the p⁺-type layer 3, but not formed in the silicon substrate 1. This enables reuse of the silicon substrate 1. For example, the porous silicon layers 30 are formed by anodization at 1 to 100 mA/cm², for example, 14 mA/cm², for 6 minutes.

Figure 13:
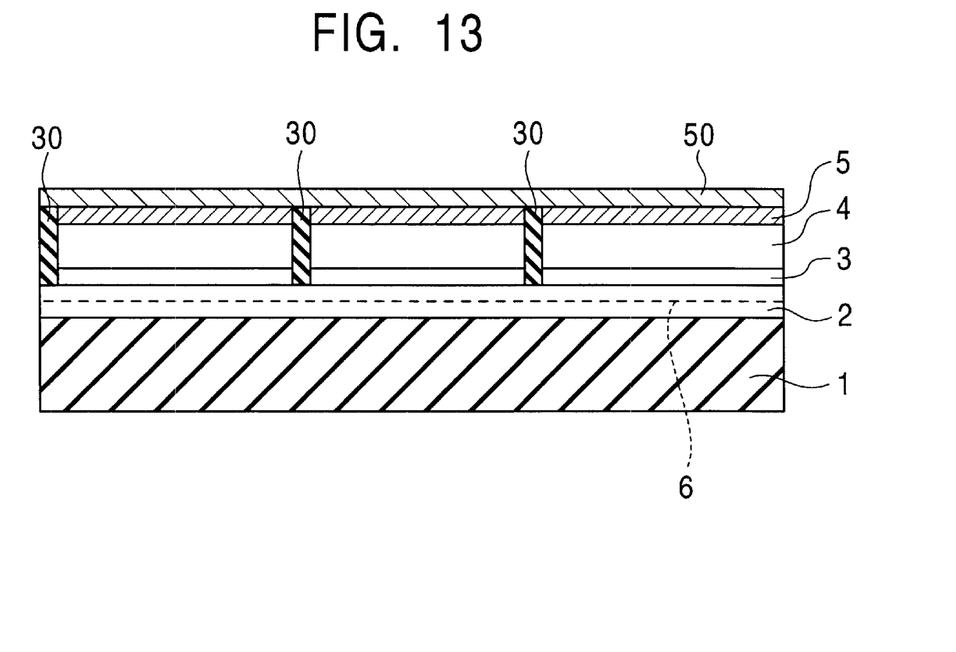
FIG. 13 is a drawing showing a step of the process for manufacturing the integrated thin film single crystal silicon solar cell in accordance with the further preferred embodiment of the present invention.

After the porous silicon layers 30 are formed by anodization so as to pass through the n⁺-type layer 5, the p-type layer 4 and the p⁺-type layer 3, and reach the porous silicon layer 2, the porous silicon layers 30 are thermally oxidized at a temperature of 800 to 1000° C. to be converted into insulating separation layers 30 for separating respective devices. At the same time, the thermal oxidation forms a silicon oxide film 50 on the surface of the n⁺-type layer 5, as shown in FIG. 13.

In accordance with this embodiment, the adjacent devices are insulated and separated from each other by the insulating separation layers 30 converted from the porous silicon layers 30 which pass through the n⁺-type layer 5, the p-type layer 4 and the p⁺-type layer 3, and reach the porous silicon layer 2. Therefore, in cutting the n⁺-type layer 5, the p-type layer 4 and the p⁺-type layer 3 to separate the adjacent devices, it is possible to effectively prevent separation of the n⁺-type layer 5, the p-type layer 4 and the p⁺-type layer 3 from the silicon substrate 1 before solar cells are formed and separated from the silicon substrate 1, thereby significantly improving workability.

Figure 14:
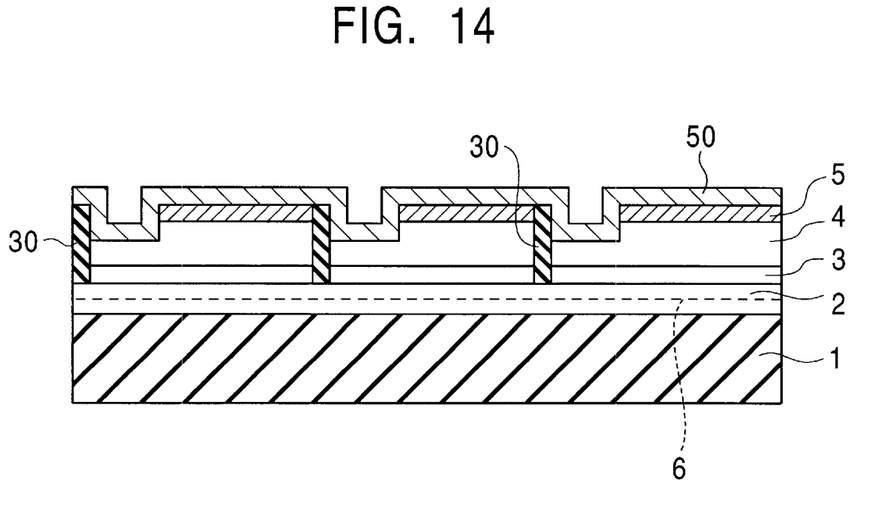
FIG. 14 is a drawing showing a step of the process for manufacturing the integrated thin film single crystal silicon solar cell in accordance with the further preferred embodiment of the present invention.

Next, as shown in FIG. 14, the n⁺-type layer 5 serving as the cathode is partially removed in the desired pattern by laser abrasion using an excimer laser to expose the p-type layer 4 serving as the anode. In this embodiment, since the n⁺-type layer 5 serving as the cathode is partially removed in the desired pattern by laser abrasion, which enables fine patterning, to expose the p-type layer 4 serving as the anode, the desired fine electrode pattern can be formed without using a photoresist mask.

Next, in order to protect the exposed p-n+ junctions, the silicon oxide film 50 is thermally oxidized at a temperature of 800 to 1000° C. to increase the thickness of the silicon oxide film 50.

Figure 15:
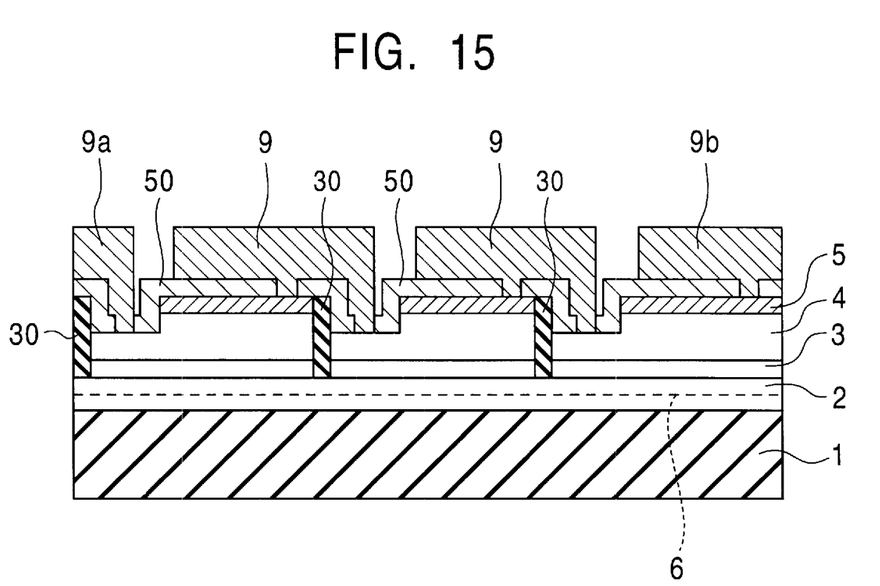
FIG. 15 is a drawing showing a step of the process for manufacturing the integrated thin film single crystal silicon solar cell in accordance with the further preferred embodiment of the present invention.

Then, as shown in FIG. 15, electrode windows are formed by laser abrasion using an excimer laser, and a plurality of electrodes 9, an anode 9a and a cathode 9b are formed in the apertures formed in the silicon oxide film 50, for example, by screen printing of metal paste. The electrodes 9 are extended over the insulating separation layers 30 to be connected to the n⁺-type layer 5 and the p-type layer 4 of the adjacent devices, and the anode 9a connected to the p-type layer 4 and the cathode 9b connected to the n⁺-type layer 5 are formed only at both ends. Like in the embodiment shown in FIGS. 8 to 11, the electrodes 9, the anode 9a, and the cathode 9b preferably have a large area in order to reflect as much as possible light incident on the back of the solar cell and transmitted therethrough.

Figure 16:
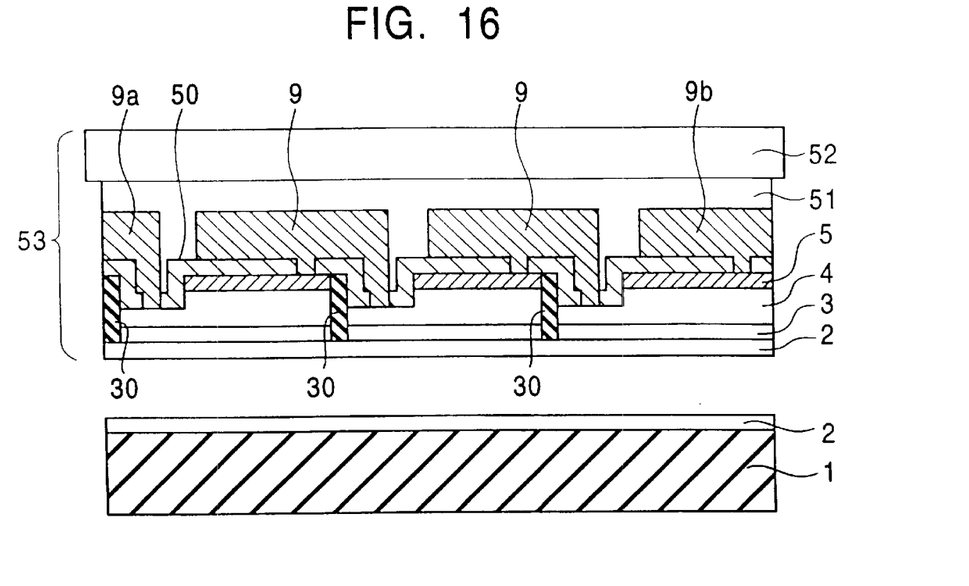
FIG. 16 is a drawing showing a step of the process for manufacturing the integrated thin film single crystal silicon solar cell in accordance with the further preferred embodiment of the present invention.

Next, an opaque plastic film 52 is bonded to the silicon substrate 1, and then the silicon substrate 1 is immersed in water or an ethyl alcohol solution, followed by irradiation of the silicon substrate 1 with ultrasonic waves of 25 kHz and 600 W, for example. As a result, the peeling strength of the separation layer 6 is weakened by ultrasonic energy to break the separation layer 6, thereby separating the silicon substrate 1 from a solar cell 53, as shown in FIG. 16.

Since the porous silicon layer 2 remains on the back of the solar cell 53 from which the silicon substrate 1 is separated, the porous silicon layer 2 remaining on the back of the solar cell 53 is removed by rotation silicon etching using a mixed solution of hydrofluoric acid and nitric acid to expose the p⁺-type layer 3. In order to decrease the rate of recombination of the exposed surface of the p⁺-type layer 3, a solution in which silica is dissolved in an organic solvent is coated on the surface of the p⁺-type layer 3 to form a silica-containing layer (not shown). The silica-containing layer is oxidized with ozone produced by UV irradiation to form a protecting film 54 having a thickness of 10 nm or less on the surface of the p⁺-type layer 3.

Namely, the silica solution in which silica is dissolved in the organic solvent containing alcohol as a main component, and ester and ketone is coated on the surface of the $p^+$-type layer 3 to form the silica-containing layer, followed by ultraviolet irradiation. As a result, ozone is produced to evaporate the organic solvent in the silica-containing layer and oxidize silica in the silica-containing layer by the produced ozone, thereby forming the protecting film 54 of silicon oxide. For example, ozone can be produced by irradiation with ultraviolet rays at a wavelength of 172 nm by using an excimer ultraviolet lamp at 1 to 100 mW/cm$^2$ for 1 second to 30 minutes, preferably at 5 to 100 mW/cm$^2$ for 1 second to 2 minutes, to form the protecting film 54 of silicon oxide.

In this embodiment, ozone is produced by ultraviolet irradiation of the surface of the $p^+$-type layer 3 on which the silica-containing layer is formed by coating the silica solution, to evaporate the organic solvent in the silica-containing layer and oxidize silica by the produced ozone, forming the protecting film 54 of silicon oxide at low temperature. Therefore, the opaque plastic film 52 having low heat resistance is not damaged, and the adhesive 51 used for bonding the opaque plastic film 52 is not damaged. In addition, no vacuum equipment is required, and the cost of the apparatus used is low, thereby permitting formation of the protecting film 54 at low cost as compared with formation of the protecting film 54 by sputtering or low-temperature CVD.

Therefore, electron diffusion from the inside of the solar cell 53 to the surface of the $p^+$-type layer 3 is prevented by the high-concentration $p^+$-type layer 3, and thus the rate of surface recombination of the $p^+$-type layer 3 and the protecting film 54 can be decreased.

Figure 17:
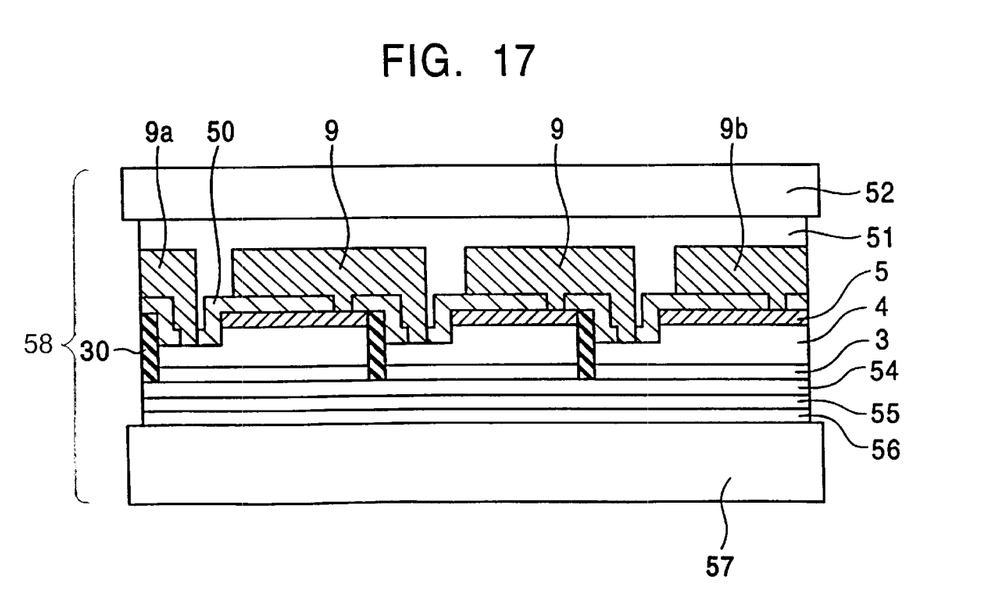
FIG. 17 is a drawing showing a step of the process for manufacturing the integrated thin film single crystal silicon solar cell in accordance with the further preferred embodiment of the present invention.

Then, a solution containing titanium oxide (TiO$_x$) is coated on the surface of the protecting film 54, and irradiated with ultraviolet rays to dry the coated film and oxidize or reduce titanium oxide, to form a titanium oxide anti-reflection film 55 mainly composed of titanium dioxide and having a thickness of 10 to 100 nm on the surface of the protecting film 54. Furthermore, a plastic film 57 is bonded to the surface of the titanium oxide anti-reflection film 55 with an adhesive 56 to produce a back contact-type integrated thin film single crystal silicon solar cell 58, as shown in FIG. 17.

In accordance with this embodiment, the $n^+$-type layer 5 serving as the cathode is partially removed in the desired pattern by laser abrasion, which enables fine patterning, to expose the p-type layer 4 serving as the anode, thereby permitting formation of the desired fine electrode pattern without using a photoresist mask.

In the back contact-type integrated thin film single crystal silicon solar cell 58 produced in this embodiment, light is incident on the plastic film 57, and thus the ineffective electrode area can be decreased due to the absence of electrodes on the incidence plane, thereby significantly improving the conversion efficiency.

Furthermore, in this embodiment, ozone is produced by ultraviolet irradiation of the surface of the $p^+$-type layer 3 on which the silica solution is coated, to evaporate the organic solvent in the silica-containing layer and oxidize silica in the silica-containing layer by the produced ozone, thereby forming the protecting film 54 of silicon oxide at low temperature. Therefore, damage to the opaque plastic film 52 having low heat resistance and damage to the adhesive 51 used for bonding the opaque plastic film 52 can be effectively prevented. In addition, no vacuum equipment is required, and the cost of the apparatus used is low, thereby permitting formation of the protecting film 54 at low cost and decreasing surface recombination, as compared with formation of the protecting film 54 by sputtering or low-temperature CVD.

In this embodiment, the adjacent devices are insulated and separated from each other by the insulating separation layers 30, which are converted from the porous silicon layers passing through the $n^+$-type layer 5 and the p-type layer 4, and the p+-type layer 3, and reaching the porous silicon layer 2. Therefore, in cutting the $n^+$-type layer 5, the p-type layer 4 and the $p^+$-type layer 3 to separate the adjacent devices, it is possible to effectively prevent separation of the $n^+$-type layer 5, the p-type layer 4 and the $p^+$-type layer 3 from the silicon substrate 1 before the solar cell 53 is formed and separated from the silicon substrate 1, thereby significantly improving workability.

The present invention is not limited to the above-described embodiments, and various changes can be made in the scope of the present invention disclosed in the claims. Of course, these changes are also included in the present invention.

For example, although a solar cell is described above in each of the embodiments, the present invention is not limited to production of the solar cell, and can also be applied to production of other types of semiconductor devices such as MOS and the like.

Although, in the above embodiments, the anodes 9a and the cathodes 9b are formed by screen-printing metal paste, the anodes 9a and the cathodes 9b can also be formed by sputtering or the like.

Although, in the embodiment shown in FIGS. 1 to 7, the transparent plastic film 11 is bonded with the adhesive 10, a transparent paper sheet may be bonded in place of the transparent plastic film 11.

Although, in the embodiment shown in FIGS. 1 to 7, the plastic film 14 on which the reflecting layer 13 is formed is bonded, with the adhesive 15, to the back of the solar cell 12 from which the porous silicon layer 2 is removed, a paper sheet or a thin film metal such as SUS or the like may be bonded in place of the plastic film 14.

Although, in the embodiment shown in FIGS. 8 to 11, the opaque plastic film 21 is bonded with the adhesive 20, while in the embodiment shown in FIGS. 12 to 19, the opaque plastic film 52 is bonded with the adhesive 51, a paper sheet or a thin film metal such as SUS may be bonded in place of the plastic film 21 or 52 regardless of whether the plastic film is transparent or not.

In the embodiment shown in FIGS. 8 to 11, or the embodiment shown in FIGS. 12 to 19, the silica solution obtained by dissolving silica in the organic solvent containing alcohol as a main component, and ester and ketone is coated on the surface of the $p^+$-type layer 3 to form the silica-containing layer, and then ozone is produced by ultraviolet irradiation to evaporate the organic solvent in the silica-containing layer and oxidize silica in the silica-containing layer by the produced ozone, thereby forming the protecting film 23 or 54 composed of silicon oxide. However, after the silica solution is coated on the surface of the $p^+$-type layer 3 to form the silica-containing layer, the organic solvent in the silica-containing layer may be evaporated at a temperature of 25 to 150° C., and then silica in the silica-containing layer may be oxidized with ozone produced by ultraviolet irradiation to form the protecting film 23 or 54. This method comprises evaporating the organic solvent in the silica-containing layer before ultraviolet irradiation, and can thus form the protecting film 23 or 54 using ozone produced by ultraviolet irradiation within a short time. Furthermore, the silica solution and the titanium oxide ($TiO_x$) solution may be successively coated on the surface of the $p^+$-type layer 3, and then irradiated with ultraviolet rays to evaporate the solvent in the silica solution and the solvent in the titanium oxide solution, and oxidize silica by the produced ozone, forming the protecting film 23 or 54 composed of silicon oxide, and successively oxidize or reduce titanium oxide, forming the titanium oxide anti-reflection film 24 or 55 mainly composed of titanium dioxide. At this time, the silica solution may be coated on the surface of the $p^+$-type layer 3 to form the silica-containing layer, and after drying the silica containing layer, the titanium oxide ($TiO_x$) solution may be coated and irradiated with ultraviolet rays to evaporate the solvent in the titanium oxide to evaporate the solvent in the titanium oxide solution, and oxidize silica with the produced ozone to form the protecting film 23 or 54 composed of silicon oxide and successively oxidize or reduce titanium oxide to form the titanium oxide anti-reflection film 24 or 55 mainly composed of titanium dioxide. Alternatively, the protecting film 23 or 54 composed of silicon oxide may be formed by sputtering or CVD at a low temperature of 150C or less in place of the formation of the protecting film 23 or 54 composed of silicon oxide by using ozone produced by ultraviolet irradiation.

Although, in the embodiment shown in FIGS. 8 to 11, and the embodiment shown in FIGS. 12 to 19, the $p^+$-type layer 3 is formed, the $p^+$-type layer 3 may not be formed when the interface recombination of the p-type layer 4 and the protecting film 23 or 54 can be decreased, thereby preventing deterioration in the conversion efficiency due to Auger recombination due to the $p^+$-type layer 3.

In the embodiment shown in FIGS. 8 to 11, and the embodiment shown in FIGS. 12 to 19, grading may be formed in the $n^+$-type layer 5 to improve the conversion efficient due to light confinement.

Although, in the above-described embodiments, the $p^+$-type semiconductor layer 3, the p-type semiconductor layer 4 and the $n^+$-type semiconductor layer 5 are formed in turn on the p-type silicon substrate 1, a n-type silicon substrate may be used, and a $p^+$-type layer or p-type layer may be used as a cathode, and a $n^+$-type or n-type layer may be used as an anode.

Although, in the embodiment shown in FIGS. 12 to 19, the porous silicon layers 30 are formed to pass through the $n^+$-type layer 5, the p-type layer 4 and the $p^+$-type layer 3 and reach the porous silicon layer 2, the porous silicon layers 30 need not be formed to reach the porous silicon layer 2 as long as the porous silicon layers 30 pass through the $n^+$-type layer 5, the p-type layer 4 and the $p^+$-type layer 3, and the porous silicon layers 30 may be formed in contact with the porous silicon layer 2.

Although the anodization apparatus shown in FIG. 18 comprises the platinum electrodes 42 and 43, the electrode material is not limited to platinum, and any electrode material such as carbon, silicon carbide, and the like, which are not corroded with hydrofluoric acid, may be used for forming the electrodes.

Although the anodization apparatus shown in FIG. 18 uses the mask 47 made of a vinyl chloride resin, the mask 47 need not be made of a vinyl chloride resin, and the mask 47 may be made of any insulating material such as fluororesin or the like, which is not corroded with hydrofluoric acid.

The present invention can provide a method of manufacturing a semiconductor device, which is capable of forming a desired electrode pattern by a simple process at low cost.

In addition, the present invention can provide a solar cell which permits a decrease in the ineffective electrode area not contributing power generation, and improvement in the conversion efficiency by a simple process at low cost.

What is claimed is:

1. A method of manufacturing a semiconductor device, the method comprising the steps of:

forming a first semiconductor layer on a substrate, forming a second semiconductor layer on the first semiconductor layer, and removing the second semiconductor layer in a predetermined pattern by laser abrasion to expose a first portion of the first semiconductor layer to form an electrode pattern.

2. The method of manufacturing a semiconductor device according to claim 1, wherein the substrate is a silicon substrate.

3. The method of manufacturing a semiconductor device according to claim 2, wherein the silicon substrate is a single crystal silicon substrate.

4. The method of manufacturing a semiconductor device according to claim 3, wherein the single crystal silicon substrate is a thin film single crystal silicon substrate.

5. The method of manufacturing a semiconductor device according to claim 1, further comprising the step of forming a porous layer between the first semiconductor layer and the substrate.

6. The method of manufacturing a semiconductor device according to claim 5, wherein the porous layer is a porous silicon layer.

7. The method of manufacturing a semiconductor device according to claim 1, wherein the first semiconductor layer is a p-type semiconductor layer, and the second semiconductor layer is a n-type semiconductor layer.

8. The method of manufacturing a semiconductor device according to claim 1, wherein the first and second semiconductor layers are formed by epitaxial growth.

9. The method of manufacturing a semiconductor device according to claim 1, further comprising the steps of:

forming an insulating film on the formed electrode pattern;

partially removing the insulating film in another predetermined pattern to expose a second portion of the first semiconductor layer that is the same or within the first portion; and forming an electrode on the exposed second portion of the first semiconductor layer.

10. The method of manufacturing a semiconductor device according to claim 9, further comprising the steps of:

bonding a transparent substrate over the electrode;

splitting the porous layer portion so that the substrate is separated from the semiconductor device; and bonding a support substrate to the back of the first semiconductor layer.

11. The method of manufacturing a semiconductor device according to claim 10, wherein the transparent substrate comprises a plastic film.

12. The method of manufacturing a semiconductor device according to claim 10, wherein the support substrate comprises a plastic film.

13. The method of manufacturing a semiconductor device according to claim 10, wherein the step of splitting the porous layer further comprises the step of irradiating the porous layer with ultrasonic waves so that a strength of the porous layer is decreased by ultrasonic energy and separation occurs within the porous layer portion.

14. The method of manufacturing a semiconductor device according to claim 10, further comprising removing the porous layer remaining on the surface of the first semiconductor layer before bonding the support substrate to the back of the first semiconductor layer.

15. The method of manufacturing a semiconductor device according to claim 9, further comprising the steps of:

bonding a support substrate over the electrode;

separating the substrate from the semiconductor device along a separation line within the porous layer portion;

forming a silicon oxide protecting layer on the back of the first semiconductor layer at a low temperature;

and bonding a transparent substrate.

16. The method of manufacturing a semiconductor device according to claim 15, wherein the transparent substrate comprises a plastic film.

17. The method of manufacturing a semiconductor device according to claim 15, wherein the support substrate comprises a plastic film.

18. The method of manufacturing a semiconductor device according to claim 15, wherein the step of separating the substrate from the semiconductor device further comprises the step of irradiating the porous layer with ultrasonic waves so that a strength of the porous layer is decreased by ultrasonic energy and separation occurs along the separation line in the porous layer portion.

19. The method of manufacturing a semiconductor device according to claim 15, further comprising removing the porous layer remaining on the surface of the first semiconductor layer before bonding the support substrate to the back of the first semiconductor layer.

20. The method of manufacturing a semiconductor device according to claim 15, wherein the first portion is one of a plurality of portions exposed in the first semiconductor layer to form the electrode pattern, and further comprising the steps of:

forming at least one porous film so as to pass through the first and second semiconductor layers between the exposed portions of the first semiconductor layer in the electrode pattern defining a plurality of solar cell devices; and thermally oxidizing the at least one porous film to form at least one insulating separation film to insulate and separate adjacent solar cell devices.

21. The method of manufacturing a semiconductor device according to claim 20, wherein not less than two porous films are formed.

22. The method of manufacturing a semiconductor device according to claim 20, wherein the porous film comprises porous silicon.

23. The method of manufacturing a semiconductor device according to claim 1, wherein the first and second semiconductor layers constitute a light generating device.

24. The method of manufacturing a semiconductor device according to claim 5, further comprising the step of annealing the porous layer to decrease a tensile strength of the porous layer without causing partial or complete separation of the substrate from the semiconductor device so that the porous layer splits when irradiated by ultrasonic waves.

25. The method of manufacturing a semiconductor device according to claim 24, wherein the step of forming a porous layer comprises the steps of:

forming a first porous layer by anodizing the substrate at a current density of between 0.5 to 3 mA/cm2 for 2 to 10 minutes; and forming a second porous layer by anodizing the substrate at a current density of between 3 to 20 mA/Cm2 for 2 to 10 minutes, wherein the second porous layer has lower tensile strength than the first porous layer after annealing such that the second porous layer splits before the first porous layer when irradiated by ultrasonic waves.

26. The method of manufacturing a semiconductor device according to claim 9, wherein the insulating film is partially removed in the other predetermined pattern by laser abrasion.

27. The method of manufacturing a semiconductor device according to claim 9, wherein the step of partially removing the insulating film in another predetermined pattern includes exposing a portion of the second semiconductor layer.

28. The method of manufacturing a semiconductor device according to claim 26, wherein the step of forming an electrode further comprises forming another electrode on the exposed portion of the second semiconductor layer.

* * * * *